United States Patent
Bergström (10) Patent No.: US 6,782,606 B2
(45) Date of Patent: *Aug. 31, 2004

(54) TAPE GUIDE AND MAGAZINE AT A COMPONENT MACHINE

(75) Inventor: Johan Bergström, Bromma (SE)

(73) Assignee: Mydata Automation AB, Bromma (SE)

( * ) Notice: Subject to any disclaimer, the term of this patent is extended or adjusted under 35 U.S.C. 154(b) by 162 days.

This patent is subject to a terminal disclaimer.

(21) Appl. No.: 09/886,482

(22) Filed: Jun. 22, 2001

(65) Prior Publication Data

US 2002/0014002 A1 Feb. 7, 2002

Related U.S. Application Data

(63) Continuation of application No. PCT/SE99/02395, filed on Dec. 16, 1999.

(30) Foreign Application Priority Data

Dec. 22, 1998 (SE) .............................................. 9804495
Mar. 23, 1999 (SE) .............................................. 9901057

(51) Int. Cl.[7] ................................................. H05K 3/30
(52) U.S. Cl. ............................. 29/740; 29/739; 29/741; 29/832; 226/128; 242/558; 242/566; 242/564.4
(58) Field of Search ......................... 29/739, 740, 741, 29/832; 226/128; 242/558, 566, 564.4

(56) References Cited

U.S. PATENT DOCUMENTS

| | | | |
|---|---|---|---|
| 4,819,699 A | 4/1989 | Brown et al. | |
| 4,820,369 A | 4/1989 | Kubo | |
| 5,053,103 A | 10/1991 | Fritsch | |
| 5,268,059 A | 12/1993 | Olson | |
| 5,725,140 A | 3/1998 | Weber et al. | |
| 6,162,007 A | 12/2000 | Witte | |
| 6,402,452 B1 | 6/2002 | Miller et al. | |
| 6,619,526 B1 | 9/2003 | Souder, Jr. | |
| 6,631,870 B2 * | 10/2003 | Bergstrom | .................. 242/615 |

FOREIGN PATENT DOCUMENTS

| | | |
|---|---|---|
| DE | 32 14 600 A1 | 10/1983 |
| EP | A1876091 | 11/1998 |
| EP | A2914034 | 5/1999 |
| EP | A2967849 | 12/1999 |

(List continued on next page.)

OTHER PUBLICATIONS

"Smart Feeders Prevent Placement Errors", Robert J. Black, Jr., Circuit Manufacturing, pp. 66–67, Jan. 1990.
Copy of brochure of Europlacer Industries, Jan. 7, 1994.
Copy of homepage printout from Europlacer, "Programmer Tape Trolley," date unknown.

*Primary Examiner*—Rick Kiltae Chang
(74) *Attorney, Agent, or Firm*—Birch, Stewart, Kolasch & Birch, LLP (57) ABSTRACT

A tape guide for guiding a carrier tape in a component mounting machine, a tape magazine for receiving the tape guide, and a system including the tape guide and the tape magazine. The carrier tape carries components that are positioned in sequence on the carrier tape and are covered by a cover tape. The tape guide includes an exposure mechanism for exposing the components at a picking position, wherein the exposure mechanism includes a separator for separating and lifting a lateral portion of the cover from the carrier tape, leaving the remaining portion of the cover at least partially attached to the carrier tape, and for bringing the lifted portion of the cover aside. The tape guide also includes a lock for enabling ready and quick attachment and detachment of the tape guide to and from the component mounting machine, a guiding for guiding the carrier tape towards a picking position, and a retainer for preventing accidental displacement of the carrier tape along the tape guide.

52 Claims, 5 Drawing Sheets

FOREIGN PATENT DOCUMENTS

| | | |
|---|---|---|
| EP | A2973369 | 1/2000 |
| GB | 2317496 | 9/1996 |
| JP | 02-077200 | 3/1990 |
| JP | 2274000 A | 11/1990 |
| JP | 4171894 | 6/1992 |
| JP | 4189433 | 7/1992 |
| JP | 5116836 | 5/1993 |
| JP | 6232591 | 8/1994 |
| WO | A1-8600778 | 1/1986 |
| WO | WO 01/81220 | 11/2001 |

* cited by examiner

TAPE GUIDE AND MAGAZINE AT A COMPONENT MACHINE

This application is a Continuation of PCT International Application No. PCT/SE99/02395 filed on Dec. 16, 1999, which was published in English and which designated the United States and on which priority is claimed under 35 U.S.C. §120, the entire contents of which are hereby incorporated by reference.

BACKGROUND OF THE INVENTION

1. Field of the Invention

The present invention generally relates to the field of manufacture and assembly of circuit boards. More specifically it relates to a tape guide for guiding a carrier tape in a component mounting machine, a tape magazine for receiving the tape guide, and a system including the tape guide and the tape magazine.

2. Description of Background Art

Generally, within the field of manufacture and assembly of circuit boards, electronic components are fed to a component mounting machine for mechanically and/or electrically mounting the components onto a circuit board. These surface mounted components are often delivered spaced apart along the length of a component tape, which consists of a lower carrier tape provided with compartments, one for each component, and an upper cover, or cover tape or protective tape. After positioning the electronic components in the corresponding compartments, the cover tape is attached to the carrier tape, and the component tape is wound on a component reel. The attachment of the cover tape to the carrier tape can, for instance, be performed by providing either the cover tape or the carrier tape with adhesive areas, or by fusing the cover tape to the carrier tape. Then, the component reel is transferred to a component mounting machine, which feeds a component to a certain predetermined picking position where it can be picked, or collected, by a pick-up head. WO 86/00778 shows a cassette magazine for a component mounting machine using the above described method.

According to the method conventionally used within the art, the loading of a component tape in a component mounting machine involves the following steps. Placing the component tape reel into the tape holder of a component mounting machine, or into a tape magazine of a component mounting machine; introducing the free end of the component tape into a feeding mechanism, provided in the machine or in the magazine, such that feeding pins engage corresponding holes provided in the component tape; separating, by hand, the end of the cover tape from the end of the carrier tape for a distance sufficient for the cover tape to be engaged with a cover tape handling means; and lowering a locking mechanism over the carrier tape for holding the carrier tape against the feeding mechanism.

Prior to the picking of the components, each component has to be exposed so as to make it available for picking. Conventionally, this is achieved by removing the cover tape from the carrier tape. The cover tape is then fed away by a separate cover tape handling means in order for the cover tape not to disturb the picking of components. Generally, the cover tape handling means comprises a winding hub on which the cover tape is wound. Additionally, when unloading the component tape from the component mounting machine, or the tape magazine, the winding hub has to be cleared of the cover tape.

A considerable length of the end of the cover tape has to be separated from the end of the carrier tape in order to bring the cover tape end to a cover tape handling means. Thus, the first decimeters of a new carrier tape are not provided with components. Otherwise, numerous components would be wasted during loading. However, when reloading a tape reel that already has been partly used, the tape is provided with components throughout, and consequently a large number of components may be wasted.

U.S. Pat. No. 4,820,369 discloses an alternative method and device for exposing the components at the picking position. According to the embodiments shown in FIGS. 7 and 8, the cover tape is separated from the carrier tape along one side of the carrier tape only, while the cover tape remains adhered to the carrier tape along the other side. Thereby, the need for separate cover tape handling means is reduced or even eliminated. Using this method, the distance of cover tape that has to be removed from the carrier tape when loading or reloading a carrier tape can be reduced, but not eliminated, thus there would still be some component waste. Further, there would also still be components wasted when unloading a carrier tape from the compartments where the components have been exposed but have not yet been picked-up. Even though this method would be preferred as compared to using a separate cover tape handling means, the loading of the carrier tape into the component mounting machine and the device for exposing the components must still be performed individually for each carrier tape. During this time, the component mounting machine must be shut off.

As realised from the above, the loading of a component tape in a component mounting machine is a time-consuming and complicated process that has to be performed every time a new component has to be added to the circuit board manufacturing process, and every time an empty component tape has to be replaced. This negatively affects the overall time efficiency of the manufacturing process and, hence, the overall costs. Additionally, when using a winding hub, or the like, for handling the cover tape, the required time for the loading process is further increased, and the unloading of the component tape includes the additional step of clearing the winding hub of the cover tape. Furthermore, there is high risk of a considerable component waste with the loading method according to prior art.

SUMMARY OF THE INVENTION

It is therefore an object of the present invention to provide a solution to the problem of complicated and time-consuming loading of a carrier tape into a component mounting machine.

A further object of the present invention is to reduce the high number of wasted components when unloading/reloading a carrier tape from/into a component mounting machine.

This and other objects are achieved according to the present invention by providing a tape guide, a tape magazine and a system having the features defined in the independent claims. Preferred embodiments are defined in the dependent claims.

For the purpose of clarity, the term lateral refers to the lateral direction of the carrier tape. The terms distal and proximal refers to the direction opposite to and along the feeding direction of the carrier tape, respectively.

The present invention is based on the insight of providing a tape guide, for guiding a carrier tape in a component mounting machine, said tape guide comprising exposure means for exposing the components at a picking position, wherein the exposure means comprises separating means for separating and lifting a lateral portion of the cover from the carrier tape, leaving the remaining portion of the cover at least partially attached to the carrier tape, and for bringing the lifted portion of the cover aside, with the ability to be releasably mounted such that the loading and/or unloading of a carrier tape into and from the tape guide can be performed away from the component mounting machine. Preferably, this is achieved according to the present invention by providing a tape guide with locking means for ready and quick attachment and detachment to interacting locking means in a component mounting machine, guiding means for guiding a carrier tape, and carrier tape retaining means for retaining the position of the carrier tape relative the tape guide.

By providing a tape guide with the ability to be loaded with a carrier tape away from a component mounting machine and to be subsequently loaded into the component mounting machine, a facilitated loading of the carrier tape into the machine, a reduced downtime of the machine, and, thereby, an improved time efficiency of the entire manufacturing process is achieved. This is due to the fact that the time-consuming process of loading the carrier tape into a component mounting machine, as described above with reference to known art, is reduced to simply placing a component tape reel into the tape holder of a component mounting machine, and mounting a tape guide into the machine. The rest of the loading process is performed beforehand and away from the component mounting machine. Thus, the downtime of the component mounting machine due to the loading of a carrier tape is limited to the actual time for placing a tape reel into the machine, and for loading a tape guide into the machine, which increases the time efficiency of the machine considerably.

The required features of the tape guide for enabling the loading of a carrier tape away from the machine and the subsequent loading of the tape guide, with the carrier tape, into the machine comprise locking means for ready and quick attachment and detachment of the tape guide into and from the machine, guiding means for correctly guiding the carrier tape into the machine, and carrier tape retaining means for retaining the position of the carrier tape relative the tape guide.

The locking means is provided for ready, quick and accurate mounting of the tape guide into the component mounting machine. The locking means of the tape guide is arranged for interaction with corresponding locking means provided on the component mounting machine, thus providing both a correct positioning and a secure mounting of the tape guide. Preferably, the locking means is in the form of resiliently biased snap-in locking means, e.g. in the form of a latch and a recess provided on the tape guide interacting with axles provided on the component mounting machine, or in the form of a catch and an axle, respectively, provided on the component mounting machine interacting with corresponding protrusion and recess provided on the tape guide. As realised by a person skilled in the art, various types of snap-in locking means, or other sorts of quick couplings, can be used for ready and quick attachment and detachment of the tape guide into and from a component mounting machine.

The guiding means is provided for guiding the carrier tape to the correct position within the component mounting machine, such that the components to be picked by a pick-up head reaches the correct picking position. The guiding means is preferably in the form of opposing grooves extending from the distal end of the tape guide to the proximal end thereof.

According to the invention, the tape guide is provided with means for exposing a component to be picked at a picking position. This exposure means comprises separating means for separating and lifting a lateral portion of the cover from the carrier tape, leaving the remaining portion of the cover at least partially attached to the carrier tape, and for bringing the lifted portion of the cover aside such that the component to be picked can be exposed. A more detailed description of such separating means will follow below.

The use of such separating means eliminates the need for means handling the cover tape after removal from the carrier tape since the cover remains attached to the carrier tape. Thereby, the loading process is even further facilitated and the loading time is reduced, reducing the downtime of the mounting machine and positively effecting the efficiency of the entire manufacturing process.

By arranging the separating means such that it covers a compartment, from the separating and lifting of the lateral portion of the cover until said compartment reaches the picking position, the number of components wasted is even further reduced. This is due to the fact that the compartments containing the exposed components are covered by the separating means both when the tape guide with the carrier tape is mounted in the component mounting machine, and when the tape guide with the carrier tape is located away from the machine. This is accomplished by the feature of the carrier tape retaining means, as described above. The carrier tape retaining means is provided for retaining the carrier tape such that the carrier tape is not accidentally displaced relative the tape guide, i.e. such that the tape guide can not move along the length of the carrier tape when the carrier tape has been loaded into the tape guide and before attachment of the tape guide into, or after detachment of the tape guide from, the component mounting machine, i.e. when the tape guide with the carrier tape is located away from the component machine. Thereby, following loading of the carrier tape into the tape guide, the tape guide is prevented from being accidentally removed from, or accidentally moved along the length of, the carrier tape. This ensures that when loading the carrier tape into the tape guide, the desired position of the carrier tape relative the component mounting machine, and its parts, can be chosen. The chosen position is then maintained until the carrier tape is released from the tape guide.

According to the most preferred embodiment of the invention, the carrier tape retaining means comprises a friction coupling, said friction coupling exerting a friction power upon the carrier tape sufficient to prevent the carrier tape from being accidentally displaced relative the tape guide. However, according to this embodiment, the friction power exerted by the coupling is insufficient to detrimentally affect the feeding action of the carrier tape into the component mounting machine, said feeding action being performed by feeding means provided in the component mounting machine. Therefore, there is no need for manipulating the friction coupling for enabling feeding of the carrier tape. Preferably, the friction coupling comprises a flexible support spring, provided in the tape guide underneath the carrier tape, and a counter support. The carrier tape is inserted between the support spring and counter support and is thereby held in place by the friction power. When removing the carrier tape from the tape guide, the carrier tape can simply be pulled out from the tape guide.

Additionally, using a flexible support spring for holding the carrier tape in place, brings the further advantage of stabilising the carrier tape, i.e. vibrations of the carrier tape when feeding the tape towards the picking position is greatly reduced, which reduces the risk of components being dislocated within their compartments. Furthermore, by using a flexible support spring for retaining the carrier tape, there will be no need for having movable parts in the tape guide, which facilitates the manufacturing of the tape guide and, hence, reduces production costs for producing the tape guide.

According to an embodiment, the exposure means constitutes part of the carrier tape retaining means. Preferably, the separating means is used for providing the counter support comprised in the friction coupling embodiment of the carrier tape retaining means described above. Thereby, no additional element is required as said counter support.

According to an embodiment of the present invention, the release of the carrier tape can either be performed manually, preferably only when the tape guide and the carrier tape are located away from the component mounting machine, or automatically, preferably when the tape guide with the carrier tape is mounted in the machine. According to said embodiment the carrier tape retaining means comprises a pivoted lever, preferably spring-loaded. The lever is at one end provided with a locking pin that, when in use, engages a hole of the carrier tape, thereby keeping the carrier tape at a position suitable for engagement by the feeding device. The lever is manually released during loading and unloading of the carrier tape into/from the tape guide, when the tape guide is located away from the component mounting machine, and is automatically released when loading the tape guide, with or without a component tape, into the component mounting machine. The automatic release of the lever is achieved by the other end of the lever, opposite the end provided with the locking pin, being engaged by a part of the component mounting machine during the attachment of the tape guide into the machine.

As described above, the carrier tape retaining means ensures that the carrier tape is held in place relative the tape guide after removal from the component mounting machine, unless manually released. Thus, the tape guide may remain attached to the carrier tape between the unloading and reloading of the tape guide. Thereby, there will be no additional removal of the cover tape from the carrier tape when reloading a carrier tape into the machine, and, hence, there will be no waste of components due to reloading of a carrier tape that already has been partly used. This will reduce the overall costs for the manufacturing process.

According to an embodiment of the present invention, the body of the tape guide is formed by an elongated open-ended profile with opposing elongated walls, and a base connecting said elongated walls. The walls are provided with the above described guiding means for guiding the carrier tape. The base is provided with an opening for receiving feeding means, provided in the component mounting machine or in an intermediate device attached to the machine, e.g. a tape magazine, for engagement with the carrier tape by protrusion through the opening and engagement with feeding holes provided on the carrier tape. Thus, the tape guide does not comprise any feeding mechanisms at all, which significantly reduces the manufacturing costs for the tape guide.

After the carrier tape has been loaded into the tape guide, the tape guide can be connected to the tape reel, according to an embodiment of the invention, by arranging holding means on the tape guide for attachment of the tape guide to a tape reel. Thereby, the carrier tape reel can not be unrolled, and the tape reel can easily be stored together with the tape guide for quick mounting into a component mounting machine.

According to an embodiment of the invention, the holding means comprises a clip for attachment of the tape guide to a tape reel. According to an alternative embodiment, the holding means comprises a piece of Velcro® on the tape guide engaging a corresponding piece of Velcro® provided on the tape reel. As realised by a person skilled in the art, various types of holding means are contemplated without extending beyond the scope of the present invention.

According to an aspect of the present invention, a tape magazine is provided for reception of at least one tape guide according to the invention, the magazine being provided with the corresponding locking means interacting with the locking means provided on the tape guide, said corresponding locking means otherwise being provided in the component mounting machine, as described above. The tape magazine is further provided with means for receiving at least one tape reel provided with a carrier tape, such that said reception can be performed when the carrier tape of the tape reel is loaded into the tape guide, and feeding means for feeding the carrier tape(s) towards the picking position. The tape magazine is coupled to, or mounted or attached to, the component mounting machine and forms an intermediate device between the tape guide, with the loaded carrier tape and tape reel, and the component mounting machine, and feeds the components to their respective picking position within the machine.

For the purposes of the interaction between the tape guide and the component mounting machine, as described in the previous paragraphs referring to the present invention, "component mounting machine" can in these paragraphs be replaced by "tape magazine".

Further details and aspects of the invention will become apparent from the following detailed description of embodiments of the invention, reference being made to the accompanying drawings, wherein like reference numerals refer to similar parts throughout.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Figure 1:
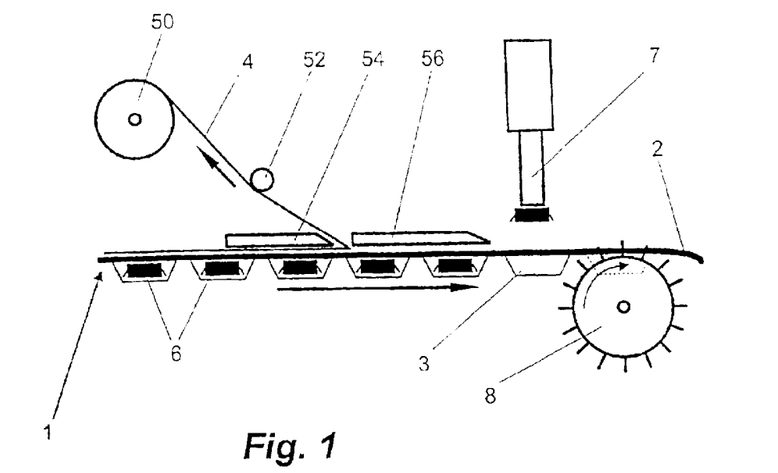
FIG. 1 is a schematic side view illustrating the principle of loading a component tape in a component mounting machine according to the state of the art.

With reference to FIG. 1, there is shown in schematic form the loading of a component tape into a component mounting machine according to the state of the art. A component tape 1, comprising a carrier tape 2, provided with compartments 3 filled with components 6, and a cover tape 4, is introduced into a feeding mechanism 8. The pins of the feeding mechanism 8 engage corresponding holes 5 provided in the carrier tape 2. The end of the cover tape 4 is removed from the carrier tape 2 and wound onto a winding hub 50, which is provided with a separate feeding mechanism (not shown). The cover tape 4 is brought past a first plate 54 provided with a stripping edge, and the cover tape 4 is stretched by a separate reel 52, applying pressure on the cover tape 4. A second plate 56 is provided after the first plate 54 for preventing small components 6, that can be electrostatically adhered to the cover tape 4, from sticking to and following the removed portion of the cover tape 4 when said portion is fed away. The second plate 56 extends to a position where the components 6 are picked by a pick-up head 7.

Figure 2:
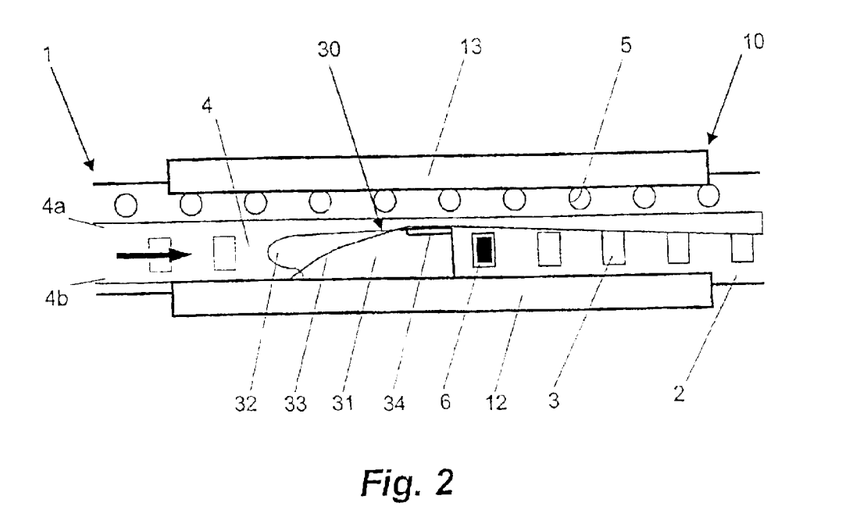
FIG. 2 is a top view illustrating the tape guide according to an embodiment of the invention.
Figure 3:
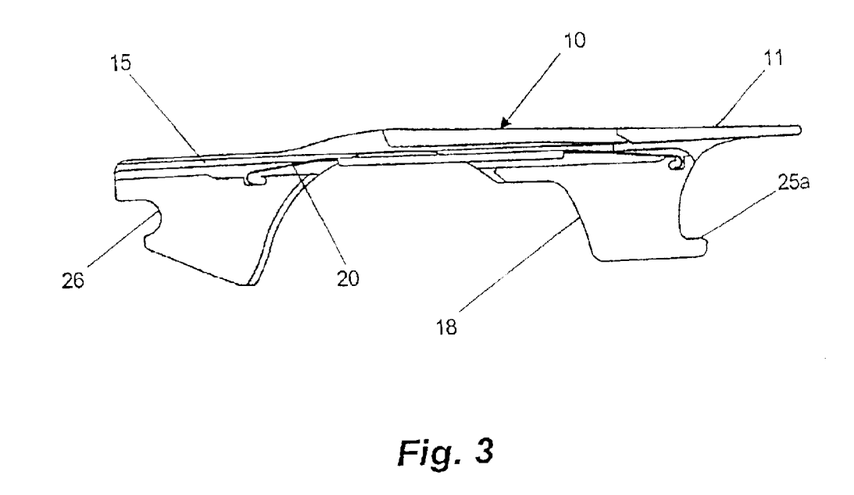
FIG. 3 is a cross sectional view of the tape guide according to a preferred embodiment of the invention.
Figure 4:
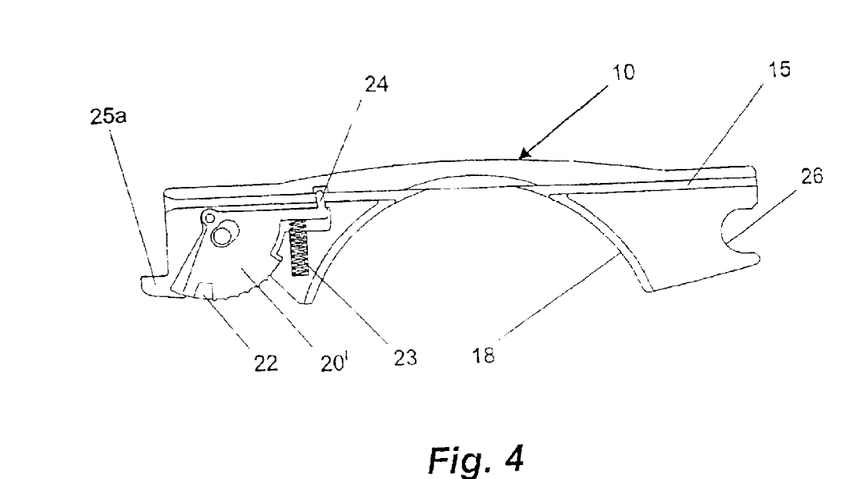
FIG. 4 is a cross sectional view of the tape guide shown according to an alternative embodiment of the invention.

Referring to FIGS. 2–4, preferred embodiments of a tape guide according to the present invention are illustrated. The tape guide 10 comprises an elongated open-ended profile with opposing elongated walls 12, 13 provided with grooves 15, for facilitating insertion of a component tape 1 and for guiding the component tape 1, and a base 14 connecting the elongated walls 12, 13. The base 14 is provided with an opening 18 for enabling the pins of a feeding device 8, provided in the component mounting machine or in a tape magazine attached to the machine, to engage the holes 5 of the carrier tape 2. According to the present invention, the tape guide is provided with separating means 30 for separating and lifting a lateral portion of the cover tape 4 from the carrier tape 2. For purposes of clarity, the separating means 30 has not been included in the cross section views of FIGS. 3 and 4. The separating means 30 comprises a first section 31 and a second section 34, the first section 31 comprising a tip portion 32, positioned at the distal end of the separating means 30, and a body portion 33. The tip portion 32 extends distally from the body portion 33, has a laterally and vertically rounded shape, and has an increased thickness in the direction extending backwards from the distal end of the tip portion 32. The tip portion 32 can be made from a rigid material and be rigidly or flexibly mounted. As an alternative, the tip portion 32 is produced from a flexible material, and is either rigidly or flexibly mounted.

The body portion 33 has a lateral extension in one direction only, the extension being sufficient to extend the body portion 33 beyond the lateral extension, or the side, of the cover tape 4. Further, the body portion 33 is elongated and has an extension in the proximal direction. Thus, the body portion 33 forms a cover plate preventing the exposure of each component 6 until said component 6 reaches the picking position. This will ensure that the components 6 can not escape from their respective compartments 3. Furthermore, the first section 31 prevents small components, which might be electrostatically adhered to the cover tape 4, from sticking to and following the lifted portion of the cover tape 4.

The second section 34 is provided on the body portion 33 of the first section 31, and extends vertically from, and essentially perpendicular to, the first section 31. According to this embodiment, said sections 31, 34 constitute portions of a single, integral device 30. As an alternative, said sections 31, 34 can be separable.

The separating means 30, according to this embodiment, is particularly well suited for cover tapes that are provided with adhesive, or fused, areas 4a, 4b along the sides of the cover tape 4, as can be seen in FIG. 2. The separating means 30 is supported by the tape guide 10 that ensures that the carrier tape 2 is properly positioned relative the separating means 30 and the pick-up head 7. The separating means 30 is positioned such that the distal end of the tip portion 32 is positioned at the lateral centre of the cover tape 4, between the adhesive areas of the cover tape 4. According to this embodiment, the position and orientation of the separating means 30 is fixed relative the tape guide 10. As an alternative, the separating means 30 as a whole, or the second section 34 alone, can be adjustable in a horizontal plane, e.g. pivotable and/or movable in the lateral direction.

When feeding the carrier tape 2 in the feeding direction, as shown by the arrow in FIG. 2, the tip portion 32 separates and lifts the cover tape 4, at the lateral centre of the cover tape 4, from the carrier tape 2. The lateral extension of the body portion 33 to one side ensures that the corresponding side 4b of the cover tape 4 is separated from the carrier tape 2. The adhesive area 4a provided on the other side of the cover tape 4 is not affected by the separating means 30 and keeps that side of the cover tape 4 attached to the carrier tape 2. Following the separation of a portion of the cover tape 4 from the carrier tape 2, this portion is brought to an upright position, at least at the picking position, by the second section 34. Thereby, the components 6 are completely exposed at the picking position.

The tape guide 10 is removably mounted to a component mounting machine, or a tape magazine, and can be removed together with the component tape 1 when unloading the component tape 1 from the component mounting machine. As can be seen in FIG. 3, the tape guide 10 is provided with a handle 11 for facilitating the attachment and detachment of the tape guide into and from the component mounting machine. In order to prevent the component tape 1 from being accidentally separated from the tape guide 10, when the tape guide 10 and the component tape 1 is not attached to a component mounting machine, or a tape magazine, the tape guide 10 is provided with carrier tape retaining means for preventing accidental displacement of the component tape 1 along the tape guide 10.

According to the most preferred embodiment of the invention, the retaining means comprises a flexible support spring 20 and a counter support, preferably in the form of the separating means 30 (not shown in FIG. 3), for insertion of a carrier tape therebetween. The support spring 21 exerts a pressure on the carrier tape 1, pressing the carrier tape against the counter support. Thereby, due to the friction between the carrier tape 1 and the retaining means, the carrier tape 1 is prevented from being accidentally displaced along the length of the tape guide 10, which means that the carrier tape 1 and the tape guide 10 remains attached when the tape guide 10 is detached from the component mounting machine. However, the friction power is insufficient to interfere with the feeding action provided by the feeding means. The support spring 20 also stabilises the carrier tape 1, such that vibrations are greatly reduced.

According to an alternative embodiment of the invention, the retaining means consists of a spring-loaded pivoted lever 20', at one end provided with a locking pin 24, and a spring 23. When in use, the locking pin 24 engages a hole 5 of the carrier tape 2, thereby also keeping the carrier tape 2 at a position suitable for engagement by the feeding device 8. The lever 20' is manually released when loading and unloading the component tape 1 from the tape guide 10, when the tape guide 10 is located away from the component mounting machine, and is automatically released when loading the tape guide 10, with or without a component tape 1, into the component mounting machine. A recess 22 is provided in the retaining means 20' for enabling said automatic release.

Figure 5:
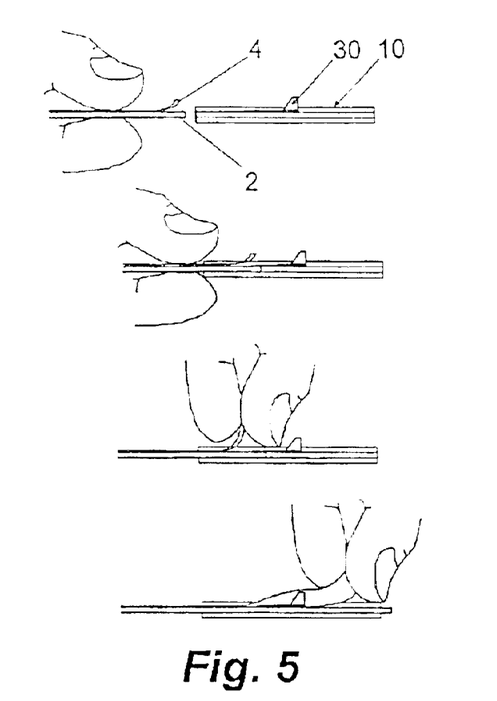
FIG. 5 is a schematic illustration of the loading of a carrier tape into a tape guide according to the invention.

Referring to FIG. 5, there is shown in schematic form the loading of a component tape 1 into a tape guide 10 provided with separating means 30 according to an embodiment of the invention. A short portion of the end of the cover tape 4 has been separated from the carrier tape 2. The end of the carrier tape 2 is fed into the tape guide and brought past the distal end of the tip portion 32 of the separating means 30, enough to position said distal end in between the respective ends of the carrier tape 2 and the cover tape 4, and enough to allow a feeding mechanism to engage the carrier tape 2. The separated end of the cover tape 4 is then grasped and pulled in the feeding direction, thereby bringing the carrier tape 2 and the cover tape 4 past the distal end of the separating means 30.

Figure 6A:
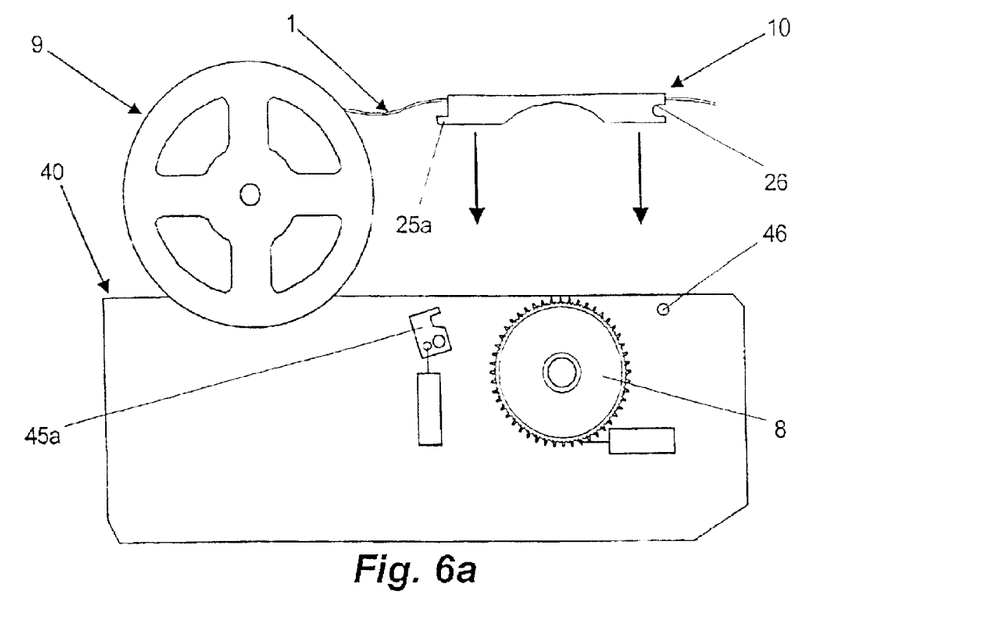
FIGS. 6a, 6b, 7 and 8 are schematic side views of tape guides and tape magazines according to alternative embodiments of the invention.
Figure 6B:
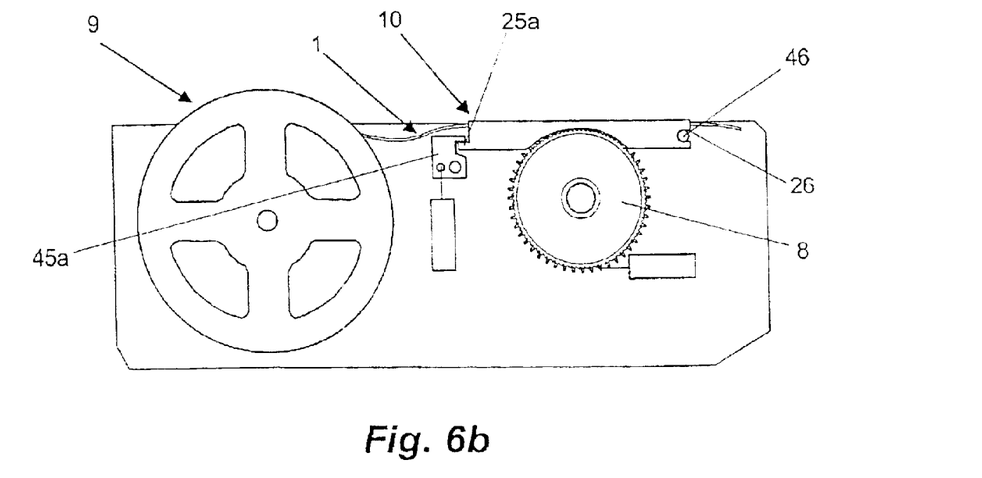

Referring to FIGS. 6a, 6b, 7 and 8, there is shown a tape reel 9, tape guides 10 and tape magazines 40 according to alternative embodiments of the invention. In FIGS. 6a and 6b, there is shown a tape reel 9 provided with a component tape 1 that has already been loaded into the tape guide 10. The figures illustrate the quick loading of the tape guide 10 into a tape magazine 40 of a component mounting machine. The tape guide 10 according one embodiment is provided with locking elements in the form of a protrusion 25a and a recess 26 provided at opposite ends of the elongated tape guide 10. These locking elements interact with corresponding locking elements 45a, 46 in the form of a catch lock 45a and an axle 46 provided in the tape magazine 40. When loading the tape guide 10 into the magazine 40 the recess 26 first engages the axle 46, then the tape guide 10 is pivoted around the axle 46 such that the catch lock 45a goes into engagement with the protrusion 25a. FIG. 6b shows the tape reel 9, the tape guide 10 and the tape magazine 40 after the tape guide 10 has been loaded into the magazine 40. For removal of the tape guide 10 from the tape magazine 40, the catch lock 45a has to be released.

Figure 7:
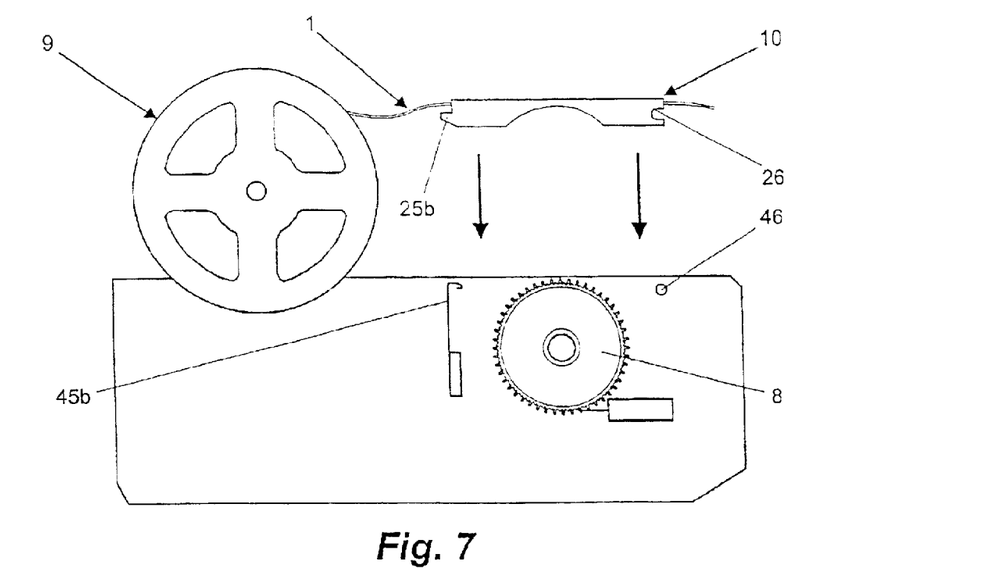

FIG. 7 shows an alternative embodiment similar to the embodiment of FIGS. 6a and 6b wherein the catch lock 45a has been replaced by a resilient snap-in locking element 45b. The loading of the tape guide 10 into the magazine 40 is similar to the loading procedure described above. Other locking elements for the tape magazine 40 are contemplated within the scope of the invention, for instance a latch or some other form of resilient locking means, preferably in a snap-in arrangement.

Figure 8:
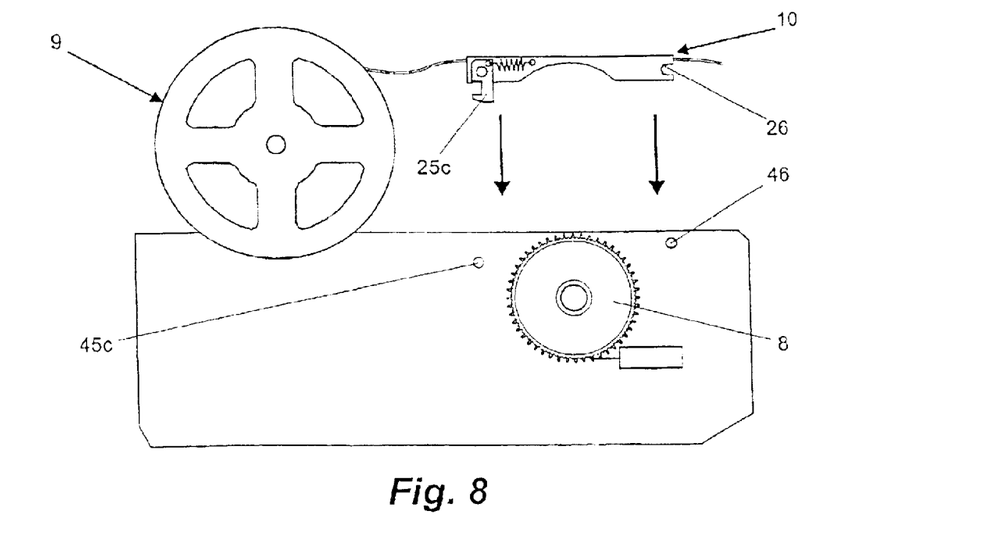

In a further embodiment shown in FIG. 8 the locking elements provided in the tape magazine 40 are rigid, here in the form of separate, spaced apart axles 45c, 46. The locking elements of the tape guide are in the form of a spring-loaded latch 25c and a recess 26. The loading of the tape guide 10 into the magazine 40 is similar to the loading procedure described with reference to FIGS. 6a, 6b and 7. Other locking elements for the tape guide are contemplated within the scope of the invention, including both rigid and/or resiliently biased elements.

As can be seen in the FIGS. 6a, 6b, 7 and 8 the tape magazine 40 is arranged for reception of the tape reel 9, as well as the tape guide 10. Preferably, a number of tape reels with corresponding tape guides can be received in a single tape magazine. The tape magazine is also arranged for reception of tape guides and tape reels of various widths. The widths of the tape reels and tape guides are, of course, adapted to the width of the component tape, which depends on the contained component.

Figure 9:
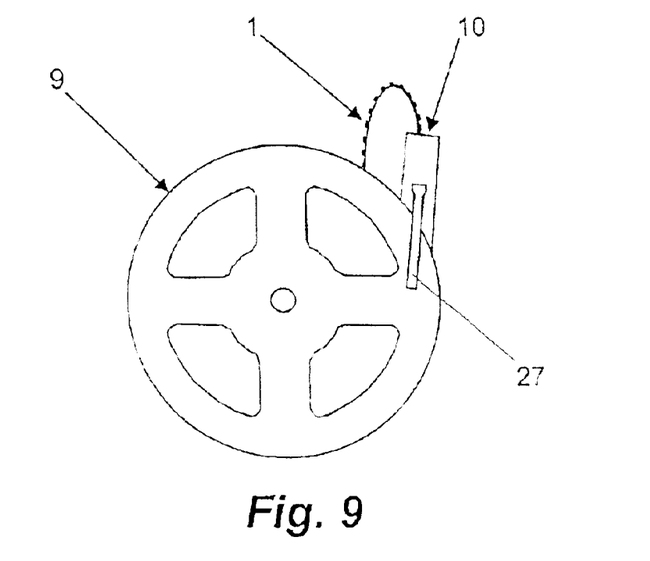
FIG. 9 is a schematic view of a tape reel and the tape guide according to an embodiment of the invention.

According to an embodiment of the present invention, the tape guide 10 is provided with holding means for attaching the tape guide 10 to the tape reel 9. An example of this is shown in FIG. 9. Here the tape guide 10 is provided with a clip 27 that ensures that the tape guide 10 is not accidentally separated from the tape reel 9 after the component tape 1 has been loaded into the tape guide 10. Thereby, the tape reel 9 can not be unrolled, and the tape reel 9 can easily be stored together with the tape guide 10 for quick mounting into a component mounting machine. In an alternative embodiment the holding means is a piece of Velcro® (not shown) for engagement with a corresponding piece of Velcro® provided on the tape reel.

As apparent from this specification, the tape guide according to the invention can be directly mounted into a component mounting machine, or mounted into a tape magazine, either when the tape magazine already is loaded into a component mounting machine or before loading of the tape magazine into a component mounting machine.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A system for mounting components on a substrate, the components being provided on a carrier tape carrying components positioned in sequence and covered by a cover, the carrier tape being wound on a carrier tape reel, comprising a component mounting machine for picking components from said carrier tape and placing them on a substrate, a component tape magazine arranged to be loaded into said component mounting machine, the magazine comprising means for reception of at least one carrier tape reel, feeding means arranged for engagement with holes provided on the carrier tape of each of said at least one carrier tape reel for feeding the carrier tape towards a picking position in said component mounting machine, and first locking means for enabling ready attachment and detachment of at least one tape guide attached to said at least one carrier tape reel into the component tape magazine, and at least one tape guide for guiding said carrier tape, the tape guide comprising second locking means for interaction with said first locking means, carrier tape retaining means for preventing accidental removal of the carrier tape from the tape guide when the tape guide is located away from the component mounting machine, and exposure means for exposing the components at a picking position.

2. A system for mounting components on a substrate, the components being provided on a carrier tape carrying components positioned in sequence and covered by a cover, the carrier tape being wound on a carrier tape reel, comprising a component mounting machine for picking components from said carrier tape and placing them on a substrate, the machine comprising means for reception of at least one carrier tape reel, feeding means arranged for engagement with holes provided on the carrier tape of each of said at least one carrier tape reel for feeding the carrier tape towards a picking position in the machine, and first locking means for enabling ready attachment and detachment of at least one tape guide attached to said at least one carrier tape reel into the machine, and at least one tape guide for guiding said carrier tape, the tape guide comprising second locking means for interaction with said first locking means, carrier tape retaining means for preventing accidental removal of the carrier tape from the tape guide and for facilitating storage of the component tape and the tape reel with the tape guide, and exposure means for exposing the components at a picking position.

3. The system according to claim 1, wherein said first and second locking means are arranged for mutual interaction in a snap-in arrangement.

4. The system according to claim 1, wherein said second locking means comprises a pair of locking elements provided spaced apart along the length of the tape guide, and wherein a portion thereof provided between said pair of locking elements is arranged for reception of said feeding means for engagement with the carrier tape.

5. The system according to claim 4, wherein said locking elements are disposed at opposite ends of the tape guide.

6. The system according to claim 1, wherein the carrier tape retaining means is arranged to retain the carrier tape by means of friction.

7. The system according to claim 1, wherein the exposure means constitutes part of the carrier tape retaining means.

8. The system according to claim 1, wherein the carrier tape retaining means comprises a flexible support spring and a counter support, said flexible support spring and counter support being arranged for insertion of the carrier tape there-between.

9. The system according to claim 1, wherein the exposure means comprises separating means for separating and lifting a lateral portion of the cover from the carrier tape, leaving the remaining portion of the cover at least partially attached to the carrier tape, and for bringing the lifted portion of the cover aside.

10. The system according to claim 1, wherein the tape guide further comprises holding means for enabling attachment of the tape guide to a carrier tape reel.

11. A component tape magazine for providing components to a component mounting machine, the components being provided on a carrier tape carrying components positioned in sequence and covered by a cover, the carrier tape being wound on a carrier tape reel, wherein the component tape magazine is arranged to be loaded into a component mounting machine, the magazine comprising means for reception of at least one carrier tape reel, feeding means arranged for engagement with holes provided on the carrier tape of each of said at least one carrier tape reel for feeding the carrier tape towards a picking position in said component mounting machine, and first locking means for enabling ready attachment and detachment of at least one tape guide attached to said at least one carrier tape reel into the component tape magazine by interacting with second locking means provided on the tape guide.

12. The magazine according to claim 11, wherein said first locking means is arranged for interaction in a snap-in arrangement with said second locking means.

13. The magazine according to claim 11, wherein said first locking means comprises a pair of locking elements provided spaced apart, and wherein said feeding means is provided there-between.

14. A tape guide for guiding a carrier tape in a component mounting machine, the carrier tape being wound on a carrier tape reel and carrying components positioned in sequence and covered by a cover, the tape guide being arranged for ready attachment and detachment into a tape magazine or a component mounting machine having first locking means, the tape guide comprising second locking means for interaction with said first locking means for enabling said ready attachment and detachment, carrier tape retaining means for preventing accidental removal of the carrier tape from the tape guide when the tape guide is located away from the component mounting machine, and exposure means for exposing the components at a picking position, wherein the tape guide is arranged for allowing feeding means provided in the magazine or the component mounting machine to engage with the carrier tape for feeding the carrier tape towards a picking position.

15. The tape guide according to claim 14, wherein said second locking means is arranged for interaction in a snap-in arrangement with said first locking means.

16. The tape guide according to claim 14, wherein said second locking means comprises a pair of locking elements provided spaced apart along the length of the tape guide, and wherein a portion thereof provided between said pair of locking elements is arranged for reception of said feeding means for engagement with the carrier tape.

17. The tape guide according to claim 16, wherein said portion is provided with an opening for allowing said feeding means to engage with the carrier tape through the opening.

18. The tape guide according to claim 16, wherein said locking elements are disposed at opposite ends of the tape guide.

19. The tape guide according to claim 14, wherein the carrier tape retaining means is arranged to retain the carrier tape by means of friction.

20. The tape guide according to claim 14, wherein the exposure means constitutes part of the carrier tape retaining means.

21. The tape guide according to claim 14, wherein the carrier tape retaining means comprises a flexible support spring and a counter support, said flexible support spring and counter support being arranged for insertion of the carrier tape there-between.

22. The tape guide according to claim 14, wherein the exposure means comprises separating means for separating and lifting a lateral portion of the cover from the carrier tape, leaving the remaining portion of the cover at least partially attached to the carrier tape, and for bringing the lifted portion of the cover aside.

23. The tape guide according to claim 14, further comprising holding means for enabling attachment of the tape guide to a carrier tape reel.

24. A tape guide for guiding a carrier tape components to a component mounting machine, the carrier tape carrying components positioned in sequence and covered by a cover, the carrier tape being wound on a carrier tape reel, wherein the tape guide is formed by an elongated body comprising proximal and distal locking elements for interaction with corresponding locking elements in a tape magazine or a component mounting machine for enabling ready attachment and detachment of a tape guide into the tape magazine or a component mounting machine, the proximal and distal locking means being provided spaced apart along the length of the elongated body, an intermediate portion adapted for receiving feeding means for engagement with and feeding said carrier tape towards a picking position, wherein said intermediate portion is located between the proximal locking means and the distal locking means, carrier tape retaining means for preventing accidental removal of the carrier tape from the tape guide when the tape guide is located away from the component mounting machine, and exposure means for exposing the components at a picking position.

25. An assembly for use at a component mounting machine, the assembly comprising a component tape reel provided with a component tape wound thereon, the component tape comprising a carrier tape carrying components positioned in sequence, and a cover covering the components, and a tape guide for guiding the component tape to a component mounting machine, the tape guide comprising locking means for interaction with corresponding locking means in a tape magazine or a component mounting machine, for enabling ready attachment and detachment of a tape guide into the tape magazine or the component mounting machine, component tape retaining means, and exposure means for exposing the components at a picking position, wherein the tape guide is loosely attached to the component tape reel via said component tape by means of said carrier tape retaining means, for preventing accidental removal of the component tape from the tape guide when the tape guide is located away from the component mounting machine, and for facilitating storage of the component tape and the reel with the tape guide.

26. The assembly as claimed in claim 25, wherein the tape guide is provided with holding means enabling direct attachment of the tape guide onto the component tape reel.

27. A system for mounting components on a substrate, the components being provided on a carrier tape carrying components positioned in sequence and covered by a cover, the carrier tape being wound on a carrier tape reel, comprising:

a component mounting machine for picking components from said carrier tape and placing them on a substrate;

a component tape magazine arranged to be loaded into said component mounting machine, the magazine comprising a receptor for receiving at least one carrier tape reel, a feeding mechanism arranged for engagement with holes provided on the carrier tape of each of said at least one carrier tape reel for feeding the carrier tape towards a picking position in said component mounting machine, and a first lock for enabling ready attachment and detachment of at least one tape guide attached to said at least one carrier tape reel into the component tape magazine; and at least one tape guide for guiding said carrier tape, the tape guide comprising a second lock for interaction with said first lock, a carrier tape retainer for preventing accidental removal of the carrier tape from the tape guide when the tape guide is located away from the component mounting machine, and an exposure mechanism for exposing the components at a picking position.

28. A system for mounting components on a substrate, the components being provided on a carrier tape carrying components positioned in sequence and covered by a cover, the carrier tape being wound on a carrier tape reel, comprising:

a component mounting machine for picking components from said carrier tape and placing them on a substrate, the machine comprising a receptor for receiving at least one carrier tape reel, a feeding mechanism arranged for engagement with holes provided on the carrier tape of each of said at least one carrier tape reel for feeding the carrier tape towards a picking position in the machine, and a first lock for enabling ready attachment and detachment of at least one tape guide attached to said at least one carrier tape reel into the machine; and at least one tape guide for guiding said carrier tape, the tape guide comprising a second lock for interaction with said first lock, a carrier tape retainer for preventing accidental removal of the carrier tape from the tape guide and for facilitating storage of the component tape and the tape reel with the tape guide, and an exposure mechanism for exposing the components at a picking position.

29. The system according to claim 27, wherein said first and said second locks are arranged for mutual interaction in a snap-in arrangement.

30. The system according to claim 27, wherein said second lock comprises a pair of locking elements provided spaced apart along the length of the tape guide, and wherein a portion thereof provided between said pair of locking elements is arranged for reception of said feeding mechanism for engagement with the carrier tape.

31. The system according to claim 30, wherein said locking elements are disposed at opposite ends of the tape guide.

32. The system according to claim 27, wherein the carrier tape retainer is arranged to retain the carrier tape by means of friction.

33. The system according to claim 27, wherein the exposure mechanism constitutes part of the carrier tape retainer.

34. The system according to claim 27, wherein the carrier tape retainer comprises a flexible support spring and a counter support, said flexible support spring and counter support being arranged for insertion of the carrier tape there-between.

35. The system according to claim 27, wherein the exposure mechanism comprises a separator for separating and lifting a lateral portion of the cover from the carrier tape, leaving the remaining portion of the cover at least partially attached to the carrier tape, and for bringing the lifted portion of the cover aside.

36. The system according to claim 27, wherein the tape guide further comprises a holder for enabling attachment of the tape guide to a carrier tape reel.

37. A component tape magazine for providing components to a component mounting machine, the components being provided on a carrier tape carrying components positioned in sequence and covered by a cover, the carrier tape being wound on a carrier tape reel, wherein the component tape magazine is arranged to be loaded into a component mounting machine, the magazine comprising:

a receptor for receiving at least one carrier tape reel, a feeding mechanism arranged for engagement with holes provided on the carrier tape of each of said at least one carrier tape reel for feeding the carrier tape towards a picking position in said component mounting machine; and a first lock for enabling ready attachment and detachment of at least one tape guide attached to said at least one carrier tape reel into the component tape magazine by interacting with a second lock provided on the tape guide.

38. The magazine according to claim 37, wherein said first lock is arranged for interaction in a snap-in arrangement with said second lock.

39. The magazine according to claim 37, wherein said first lock comprises a pair of locking elements provided spaced apart, and wherein said feeding mechanism is provided there-between.

40. A tape guide for guiding a carrier tape in a component mounting machine, the carrier tape being wound on a carrier tape reel and carrying components positioned in sequence and covered by a cover, the tape guide being arranged for ready attachment and detachment into a tape magazine or a component mounting machine having a first lock, the tape guide comprising:
- a second lock for interaction with said first lock for enabling said ready attachment and detachment;
- a carrier tape retainer for preventing accidental removal of the carrier tape from the tape guide when the tape guide is located away from the component mounting machine; and
- an exposure mechanism for exposing the components at a picking position,
- wherein the tape guide is arranged for allowing a feeding mechanism provided in the magazine or the component mounting machine to engage with the carrier tape for feeding the carrier tape towards a picking position.

41. The tape guide according to claim 40, wherein said second lock is arranged for interaction in a snap-in arrangement with said first lock.

42. The tape guide according to claim 40, wherein said second lock comprises a pair of locking elements provided spaced apart along the length of the tape guide, and wherein a portion thereof provided between said pair of locking elements is arranged for reception of said feeding mechanism for engagement with the carrier tape.

43. The tape guide according to claim 42 wherein said portion is provided with an opening for allowing said feeding mechanism to engage with the carrier tape through the opening.

44. The tape guide according to claim 42 wherein said locking elements are disposed at opposite ends of the tape guide.

45. The tape guide according to claim 40, wherein the carrier tape retainer is arranged to retain the carrier tape by means of friction.

46. The tape guide according to claim 40, wherein the exposure mechanism constitutes part of the carrier tape retainer.

47. The tape guide according to claim 40, wherein the carrier tape retainer comprises a flexible support spring and a counter support, said flexible support spring and said counter support being arranged for insertion of the carrier tape there-between.

48. The tape guide according to claim 40, wherein the exposure mechanism comprises a separater for separating and lifting a lateral portion of the cover from the carrier tape, leaving the remaining portion of the cover at least partially attached to the carrier tape, and for bringing the lifted portion of the cover aside.

49. The tape guide according to claim 40, further comprising a holder for enabling attachment of the tape guide to a carrier tape reel.

50. A tape guide for guiding a carrier tape components to a component mounting machine, the carrier tape carrying components positioned in sequence and covered by a cover, the carrier tape being wound on a carrier tape reel, wherein the tape guide is formed by an elongated body comprising:
- proximal and distal locking elements for interaction with corresponding locking elements in a tape magazine or a component mounting machine for enabling ready attachment and detachment of a tape guide into the tape magazine or the component mounting machine, the proximal and distal locking elements being provided spaced apart along the length of the elongated body;
- an intermediate portion adapted for receiving a feeding mechanism for engagement with and feeding said carrier tape towards a picking position, wherein said intermediate portion is located between the proximal locking element and the distal locking element;
- a carrier tape retainer for preventing accidental removal of the carrier tape from the tape guide when the tape guide is located away from the component mounting machine; and
- an exposure mechanism for exposing the components at a picking position.

51. An assembly for use at a component mounting machine, the assembly comprising:
- a component tape reel provided with a component tape wound thereon, the component tape comprising a carrier tape carrying components positioned in sequence, and a cover covering the components; and
- a tape guide for guiding the component tape to a component mounting machine, the tape guide comprising a lock for interaction with a corresponding lockin a tape magazine or a component mounting machine, for enabling ready attachment and detachment of a tape guide into the tape magazine or the component mounting machine, a component tape retainer, and an exposure mechanism for exposing the components at a picking position,
- wherein the tape guide is loosely attached to the component tape reel via said component tape by said carrier tape retainer, for preventing accidental removal of the component tape from the tape guide when the tape guide is located away from the component mounting machine, and for facilitating storage of the component tape and the reel with the tape guide.

52. The assembly as claimed in claim 51, wherein the tape guide is provided with a holder enabling direct attachment of the tape guide onto the component tape reel.

* * * * *